(12) United States Patent
Sano et al.

(10) Patent No.: US 6,677,580 B1
(45) Date of Patent: Jan. 13, 2004

(54) PHOTO-INTERRUPTER AND SEMICONDUCTOR DEVICE USING IT

(75) Inventors: Masashi Sano, Kyoto (JP); Nobuaki Suzuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/089,801

(22) PCT Filed: Oct. 4, 2000

(86) PCT No.: PCT/JP00/06915

§ 371 (c)(1),
(2), (4) Date: Apr. 4, 2002

(87) PCT Pub. No.: WO01/26162

PCT Pub. Date: Apr. 12, 2001

(30) Foreign Application Priority Data

Oct. 7, 1999 (JP) .............................. 11-287390
Nov. 17, 1999 (JP) .............................. 11-326757

(51) Int. Cl.[7] .............................. H01J 40/14; H01J 5/02
(52) U.S. Cl. ...................... 250/239; 250/551; 257/433
(58) Field of Search ................................. 250/551, 239, 250/216, 221, 222.1, 214 SW; 257/81–82, 433; 385/92; 439/567

(56) References Cited

U.S. PATENT DOCUMENTS 5,436,472 A * 7/1995 Ogawa ........................ 257/82
5,567,953 A * 10/1996 Horinouchi et al. ......... 250/551
5,655,042 A * 8/1997 Atanovich et al. ............ 385/88
6,459,099 B1 * 10/2002 Sano ........................... 257/82

* cited by examiner

*Primary Examiner*—David Porta
*Assistant Examiner*—Patrick J. Lee
(74) *Attorney, Agent, or Firm*—Morgan, Lewis & Bockius LLP

(57) ABSTRACT

To provide a photo-interrupter which can anchor a light-emitting device and a light-receiving device to a concave case in an expensive configuration.

The photo-interrupter (1) includes a light-emitting device (6) and a light-receiving device (7) each with a lens projected forward being housed oppositely to each other within an concave case (2) of an opaque resin mold. The sides of the lenses (6a) and (7a) of the light-emitting device (6) and the light-receiving device (7) are secured onto the end faces 5x and 5y of openings (5a) and (5b) formed on the opposite inner surfaces of the case (2). The left and right outer surfaces (2x) and (2y) of the case (2) are bent to form pressing portions (2u) and (2v) The backs of the light-emitting device (6) and the light-receiving device (7) are pressed by the pressing portions so that they are anchored to the case (2).

5 Claims, 9 Drawing Sheets

PHOTO-INTERRUPTER AND SEMICONDUCTOR DEVICE USING IT

TECHNICAL FIELD

This invention relates to a photo-interrupter and a semiconductor device using the same, and more particularly to a photo-interrupter which can mount a light-emitting device and a light receiving device in a concave case in an inexpensive configuration and stably couple hooks for hooking a base plate with the left and right outer surfaces of the case, and a semiconductor device such as an interrupter which is attached into a hole of the base plate, particularly a semiconductor device characterized by a structure of its attaching legs and provided with a floatage suppressing piece for suppressing the floatage in a state attached to the base plate.

BACKGROUND ART

A photo-interrupter with a light-emitting device and a light-receiving device oppositely arranged apart from each other by a predetermined distance and integrated to each other detects whether or not there is an object between the light-emitting device and the light-receiving device on the basis of a change in an amount of light received by the light-receiving device. Such a photo-interrupter houses the light-emitting device and light-receiving device molded by translucent synthetic resin within a case molded by opaque synthetic resin.

FIG. 3 is a schematic longitudinal front view showing an example of a conventional photo-interrupter. In FIG. 3, reference numeral 20 denotes a photo-interrupter; 2 a case molded in a concave shape by opaque synthetic resin; and 3a, 3b hooks for hooking a base plate which are coupled with outer surfaces 2x and 2y located on left and right sides of the concave case 2, extended horizontally and bent vertically to form hook pieces 4a and 4b for hooking the base plate at their tips. These hooks 3a and 3b are molded by opaque synthetic resin integrally to the concave case 2.

Reference numerals 5a and 5b denote openings formed on left and right inner surfaces 2a and 2b of the concave case 2 which are opposite to each other. A light-emitting device 6 and a light-receiving device 7 are housed in spaces within the case 2. The light-emitting device 6 is provided with a lens 6a which projects forward. The light-receiving device 7 is provided with a lens 7a which projects forward.

The lens 6a and lens 7a are arranged oppositely to each other in the openings 5a and 5b so that the output light emitted from the light-emitting device 6 is received by the light-receiving device 7. As seen from a perspective view of FIG. 4, the opening 5a is formed in a groove shape having a prescribed length from the upper surface 2s. Reference numeral 5x denotes an end face of the opening 5a. The opening 5b is also formed in the same shape as that of the opening 5a.

Numeral 6b denotes a lead terminal of the light-emitting device 6, whereas numeral 7b denotes a lead terminal of the light-receiving device 7. Numeral 8a denotes an adhesive which fixes the light-emitting device 6 to the side wall of the case 2, whereas numeral 8b denotes an adhesive which fixes the light-receiving device 7 to the side wall of the case 2.

A configuration in which the light-emitting device 6 and the light-receiving device 7 are fixed to the side walls of the case 2 using the adhesives 8a and 8b presents a problem of increasing the number of man-hours of assembling the photo-interrupter 20. Application of a small amount of adhesive will peel the light-emitting device 6 and light-receiving device 7. Therefore, the amount of the applied adhesive must be controlled appropriately. This presents a problem of making the process management complicated.

In order to overcome such an inconvenience, a photo-interrupter having a configuration in which the light-emitting device 6 and the light-receiving device 7 anchored to the case using pallets formed inside the case 2 has been developed. FIG. 5 is a schematic longitudinal front view of an example in which the light-emitting device 6 and the light-receiving element 7 are anchored using pallets 8x and 8y formed inside the case 2. In FIG. 5, like reference numerals refer to like parts in FIG. 3.

Where such pallets are formed inside the case 2, the bottoms of the light-emitting device 6 and the light-receiving device 7 are aligned with the pallets by warping the portion sandwiched by two slits passing through the side walls from the outer surfaces 2x and 2y of the concave case to the internal spaces.

FIG. 6 is a schematic perspective view showing an example in which the above two slits 9 having a prescribed length from the bottom of the case 2 are formed in the outer surface 2x. The slits 9 has a depth which reaches the space in which the light-emitting device 6 is housed inside the case 2 through the side wall. Similar slits are also formed in the outer surface 2y on the side in which the light-receiving device 7 is housed. With the light-emitting device 6 inserted into the internal space of the case 2, the portion of the outer surface 2x sandwiched by the two slits 9 is swung in a direction of arrow A so that it warps. Then, the light-emitting device 6 is anchored by the pallet formed inside the case.

FIG. 8 is a perspective view showing an example in which two slits 10 each having a prescribed length from the upper surface 2s of the case 2 are formed in the outer surface 2x to provide a portion 2c sandwiched therebetween.

FIG. 10 is a perspective view showing an example in which two slits 11 each having a prescribed length are formed centrally in the outer surface 2x.

In the examples of FIGS. 8 and 10, the same slits as formed in the outer surface 2x are formed in the outer surface 2y.

The configuration as illustrated in FIG. 5 in which the pallets for anchoring are formed inside the case has presented a problem that the mold is generally complicate. Further, as illustrated in FIG. 6, when the slits each having a prescribed length from the bottom of the case are formed in the left and right outer surfaces, as seen from a perspective view of FIG. 7, where the hooks 3a and 3b (3b not shown) for hooking the base plate are provided on the outer surfaces 2x and 2y to support the weight of the photo-interrupter, these hooks are coupled with the outer surfaces aside from the positions where the slits are formed.

This fact presented a problem that the assembled structure provides reduced mechanical strength and poor stability. In addition, the coupling portion between the hook for hooking the base plate and the outer surface of the case is unstable. This also presented a problem that the position of the hook piece, formed at the tip of the hook, relative to the base plate is not stable.

Further, as illustrated in FIG. 8, where two slits 10 each having a prescribed length from the upper surface 2s of the case 2 are formed, the hooks for hooking the base plate are formed on the left and right outer surfaces. This make it impossible to extend the slits downward. Therefore, as seen from a partial longitudinal front view of FIG. 9, where the light emitting device 6 inserted into the case 2 from a direction of arrow B is anchored by the pallet 8x provided inside the case 2, the portion 2c sandwiched between the two slits 10 is shortened so that it does not warp sufficiently in a direction of arrow. This presented a problem that the operation of anchoring the light-emitting device 6 becomes difficult. Likewise, the operation of anchoring the light-receiving device became difficult.

As seen from FIG. 10, where two slits each having a prescribed length are formed centrally in the left and right outer surfaces of the concave case, a sliding mold is required so that the mold structure becomes complicated. This presented a problem of an increase in the product price.

Further, traditionally, the semiconductor device such as a photo-interrupter has been attached to the base plate in such a manner that the attaching legs provided on the lower end of the semiconductor deice are inserted into the holes formed in the base plate.

FIG. 14 is an enlarged view of the attaching leg of a conventional interrupter. As seen from FIG. 14, the leg structure is provided with a wedge portion engaged with an edge of the hole of the base plate at the lower part of the thin elastic leg body which extends vertically downward from the interrupter. The wedge portion is composed of a flat plane which extends at an approximately right angle outwardly from the leg body and an inward sloping guide plane which is formed on the rear side of the flat plane 112a and is used to attach the leg in the hole of the base plate.

Therefore, in attaching the interrupter, since the interrupter is pushed into the hole 117a the base plate, the guide plane 112b is pushed in contact with the edge of the hole. As a result, the leg body bends and retreats inward because of its elasticity so that it is inserted into the hole. Subsequently, when the wedge portion at the lower end of the leg passes the hole, the leg is released from the pressure by the wall of the hole 117a and bursts outward. The horizontal plane 112a is brought into contact with the rear side of the base plate and the wide portion 112c at the upper position of the leg so that the leg stops. Thus, the leg 112 is fixed to the base plate in such a fashion that its upper portion and lower portion are supported by the front surface and the lower surface of the base plate, respectively.

In the case of such a leg structure, if the interval between the upper wide portion 112c of the leg and the lower horizontal surface 112a is equal to the thickness of the base plate, i.e. is determined ideally, no gap is generated between the leg and the base plate so that the interrupter can be firmly anchored to the base plate at a right angle thereto.

However, actually, the thickness of the base plate and the size of the leg have an error in manufacture so that the thickness of the base plate cannot be made equal to the interval between the upper wide portion 112c and the lower horizontal plane 112a. Therefore, in the state where the interrupter is anchored to the base plate, the interrupter still rattles in the hole and its anchoring is not stable. The unstable anchoring makes it impossible to carry out an accurate detecting operation. In extreme cases, the interrupter cannot be used as a sensor.

Soldering the electrode of the semiconductor device to the electrode of the base plate results in shrinkage of the hardened solder paste. This exerts the shrinkage force between the semiconductor and the base plate so that the portion of the base plate attached to the semiconductor device may swell. In this case also, misregistration of the semiconductor device occurs. Where the semiconductor device is a sensor such as a photo-interrupter, there is a fear that an accurate detecting operation cannot be performed.

This invention has been accomplished in view of the problems described above. An object of this invention is to provide a photo-interrupter which can anchor a light-emitting device and a light-receiving device to a concave case in an expensive configuration, and couples hooks for hooking a base plate with the left and right outer surfaces of the case.

Another object of this invention is to provide an anchoring leg structure which permits a semiconductor device such as a photo-interrupter to be anchored to the base plate easily and surely in a simple structure.

Still another object of this invention is to provide a semiconductor device which can be prevented from floating because it is located properly even when a base plate floats due to shrinkage in the soldering paste.

DISCLOSURE OF THE INVENTION

The above object can be attained in a first aspect of the invention by a photo-interrupter with a light-emitting device and a light-receiving device each with a lens projected forward being housed oppositely to each other within an concave case of an opaque resin mold, characterized in that the case is monolithically formed using a transfer mold, and includes a light-emitting device holding section and a light-receiving holding section which are provided oppositely to each other and configured to hold a light-emitting device and a light-receiving device inside, respectively; and the light-emitting device holding section and the light-receiving holding section have openings for securing sides of the projected portions thereof so that the projected lenses of the light-emitting device and the light-receiving device are opposite to each other, respectively, and have pressing portions for elastically securing the light-emitting device and the light-receiving device from behind them, respectively.

The second aspect of the invention is characterized in that the sides of the lenses of the light-emitting device and the light-receiving device are secured onto the end faces of the openings formed in opposite inner surfaces of the case, the backs of the light-emitting device and the light-receiving device are pressed by the pressing portions which were formed by bending the outer surfaces of the case, and the light-emitting device and the light-emitting device are anchored to the case.

The third aspect of the invention is characterized in that the case has the inner surfaces where the openings of the case are formed integrally to the outer surfaces on the opposite sides and hooks for hooking a mounting base plate.

The fourth aspect of the invention is characterized in that the hooks pass through mounting grooves in the mounting base plate to anchor the case to the mounting base plate elastically.

The fifth aspect of the invention is characterized in that the light-emitting device and the light-receiving device are provided with lead terminals to be connected to a circuit pattern formed in the mounting base plate.

In accordance with the above features of this invention, the light-emitting device and the light-receiving device each is held to distribute the weight at two points by the end face of the opening formed in the case and the pressing portion formed on the outer surface, respectively so that they can be surely anchored in the case in a simple configuration. Unlike the conventional case, since the light-emitting device and light-receiving device can be held with no slit, the case which permits a simple mold structure to be used for integral molding and provide improved workability can be obtained.

Further, since no slit is provided on the outer surface of the case, reduction in the mechanical strength of the case can be avoided, and the hooks for hooking the base plate can be stably coupled with the base plate.

The sixth aspect of the invention is a semiconductor device provided with a mounting leg to be inserted into a mounting hole of a base plate, characterized in that the mounting leg includes an elastic vertical leg body which extends downward from a body of the case and a contact portion to be brought into elastic contact with a lower edge of the mounting hole at a lower part of the leg body, and the contact portion has a slope which slopes out-downward from the side of the vertical leg body.

The seventh aspect of the invention is characterized in that the sloping angle of the slope to a horizontal plane is 45° or less.

The eighth aspect of the invention is characterized in that it is provided with an attachment stabilizing piece which extends outwards from the side of the lower portion of the semiconductor device body and a horizontal lower face which is brought into contact with a surface of the base plate when the semiconductor device is attached to the base plate.

The ninth aspect of the invention is characterized in that the attachment piece is arranged on the side perpendicular to the contact portion.

The tenth aspect of the invention is characterized in that a floatage suppressing piece is provided on the side surface of the case body.

The eleventh aspect of the invention is characterized in that the floatage suppressing piece is formed in contact with a chassis or frame.

The twelfth aspect of the invention is characterized in that the case is molded monolithically by a transfer mold.

In accordance with these configurations, the semiconductor device can be mounted easily and surely.

Figure 1:
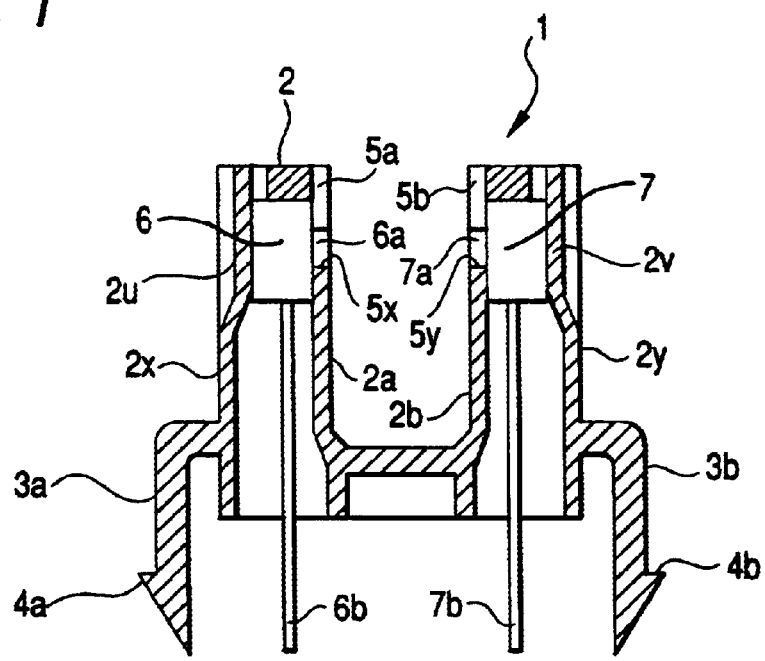
FIG. 1 is a longitudinal front view of a photo-interrupter according to an embodiment of this invention.

In these figures, reference numeral 1 denotes a photo-interrupter; 2 a case; 2u, 2v a pressing portion; 5a, 5b an opening; 6 a light-emitting device; 6a a lens; 6b, 6c a lead terminal; 7 a light-emitting device; 7a a lens; 7b a lead terminal; 11 a semiconductor device body; 12 a leg; 15 an anchor-stabilizing piece; 16 a swell-suppressing piece; 17 a base plate; and 17b an anchoring hole.

BEST MODE FOR CARRYING OUT THE INVENTION

Figure 2:
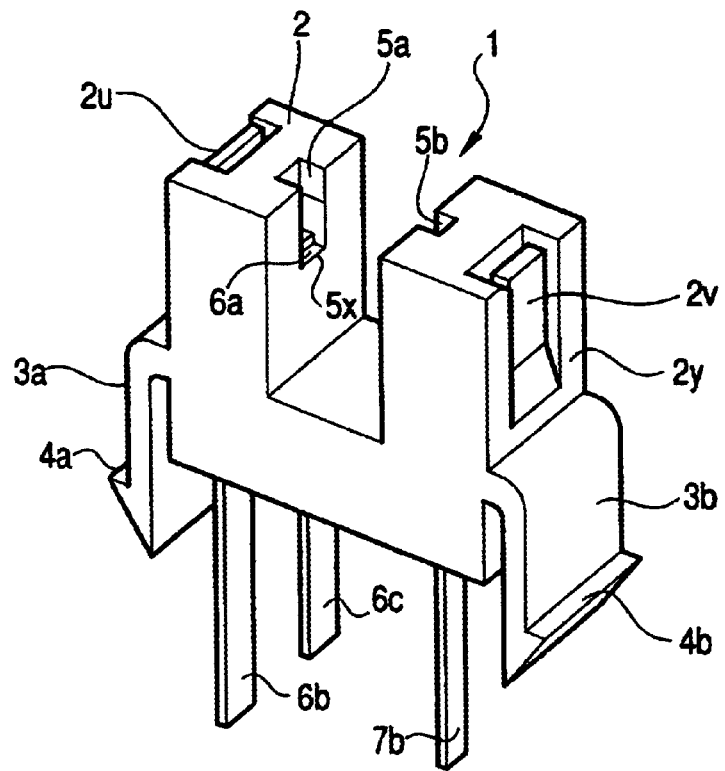
FIG. 2 is a schematic perspective view of the photo-interrupter shown in FIG. 1.
Figure 3:
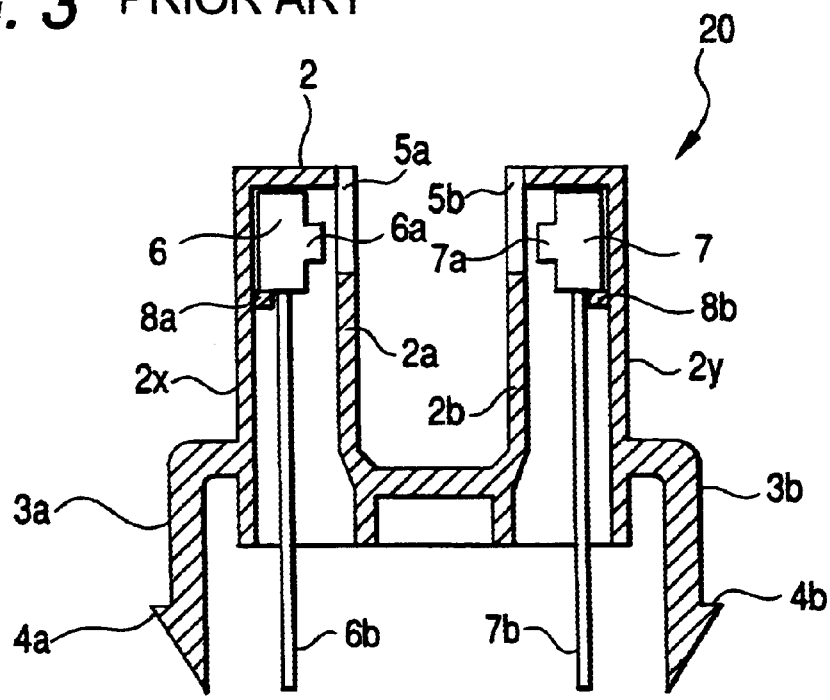
FIG. 3 is a schematic longitudinal sectional view of a photo-interrupter according to a prior art.
Figure 4:
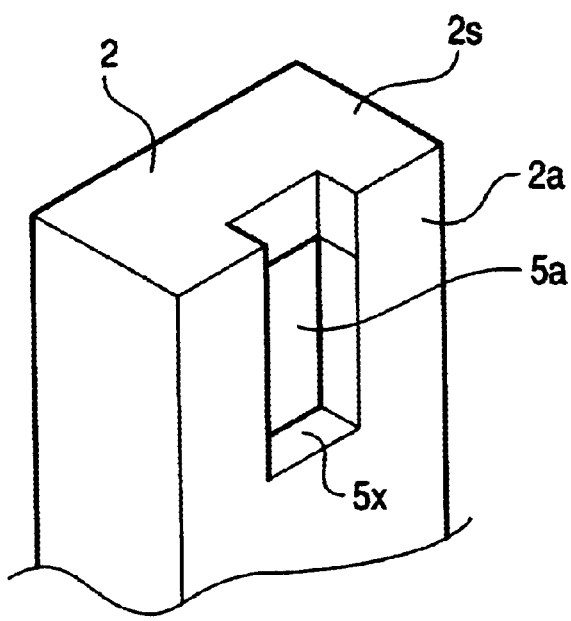
FIG. 4 is a perspective view showing an opening of the photo-interrupter.
Figure 5:
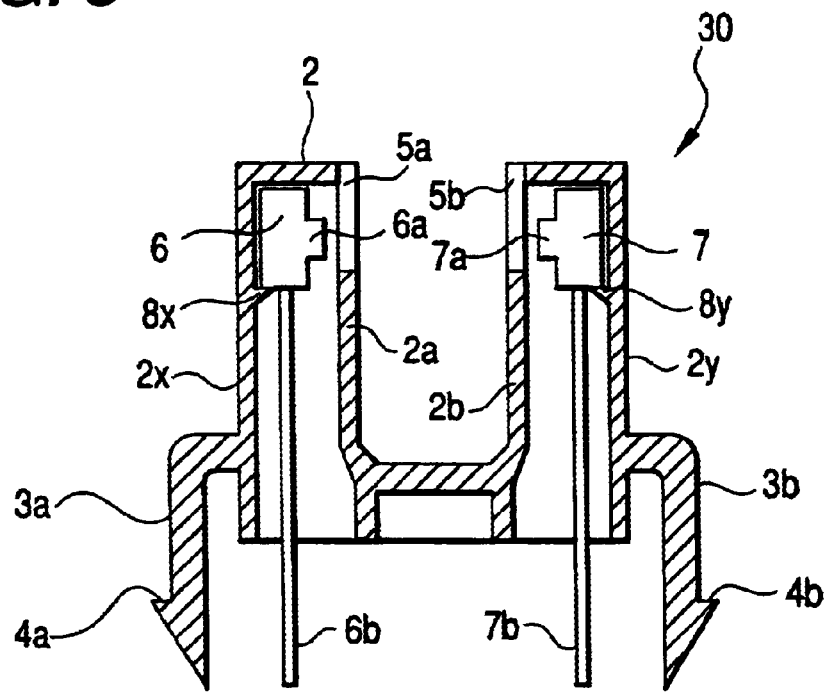
FIG. 5 is a longitudinal front view of the photo-interrupter according to the prior art.
Figure 6:
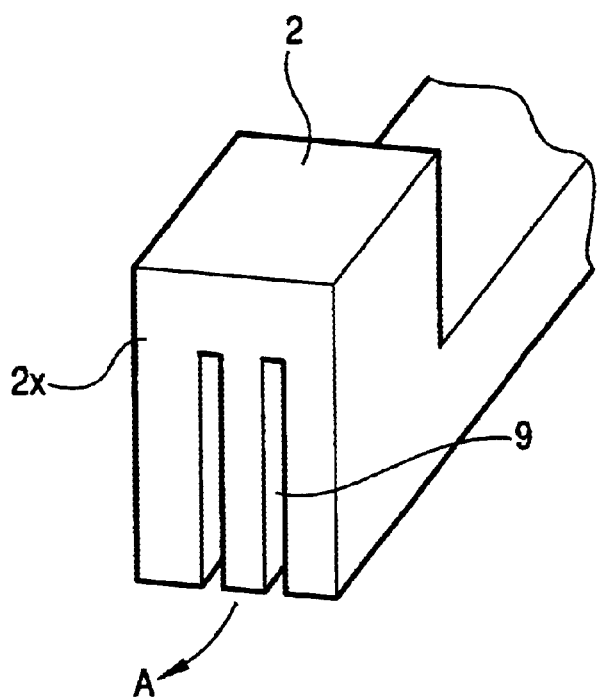
FIG. 6 is a schematic perspective view of an example of slits formed on the left and right outer surfaces.
Figure 7:
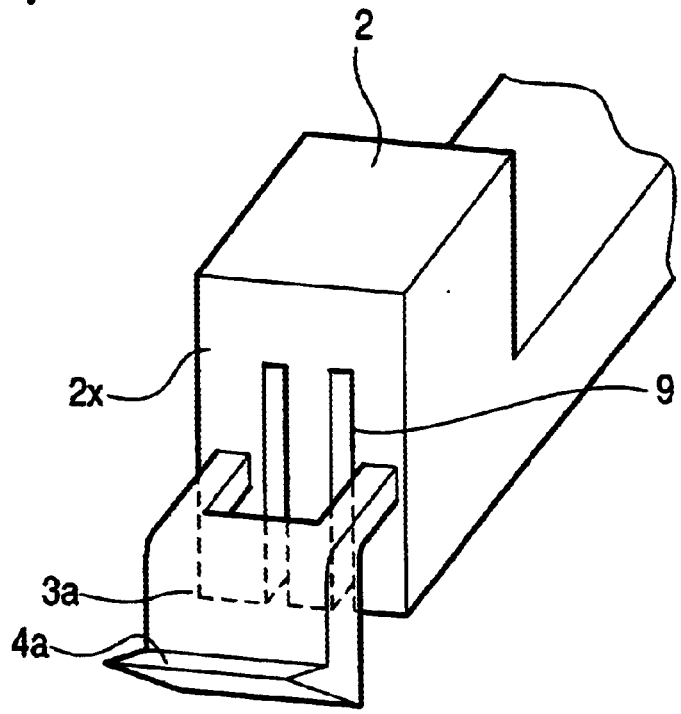
FIG. 7 is a schematic perspective view of an example of FIG. 6 equipped with a hook for hooking a base plate.
Figure 8:
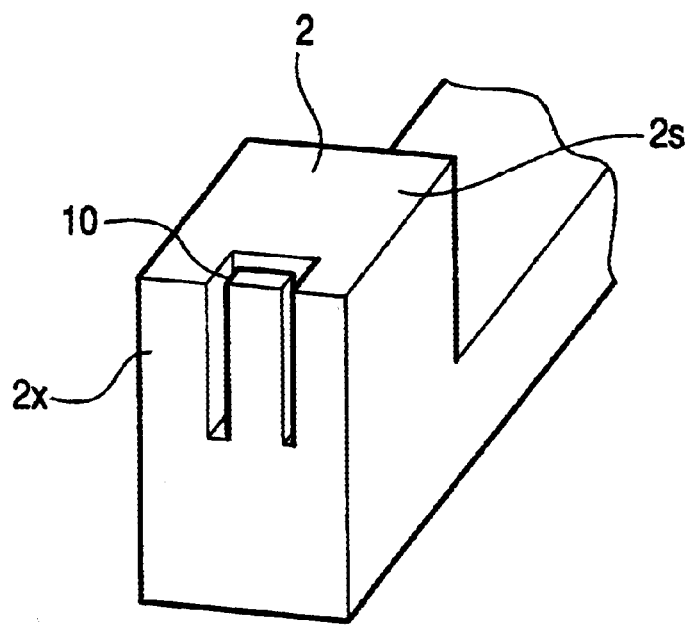
FIG. 8 is a schematic perspective view of an example of slits formed on the left and right outer surfaces.
Figure 9:
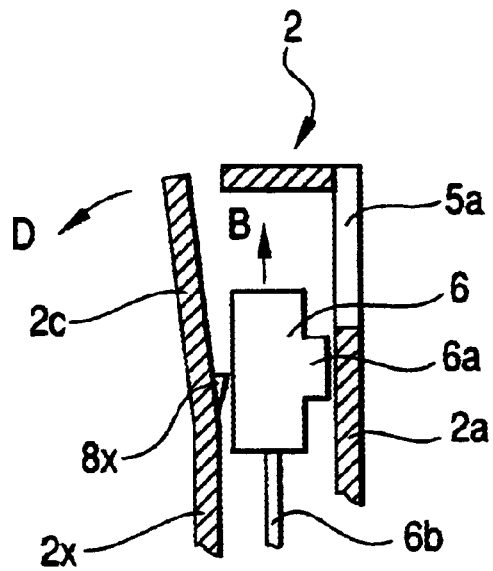
FIG. 9 is a partial longitudinal front view of FIG. 8.
Figure 10:
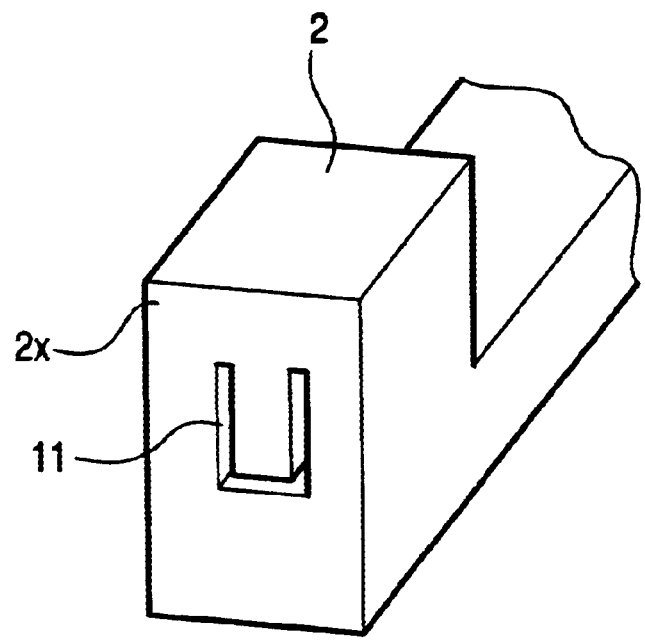
FIG. 10 is a schematic perspective view of an example of slits formed on the left and right outer surfaces.

Now referring to the drawings, an explanation will be given of various embodiments of this invention. FIG. 1 is a schematic front view of a photo-interrupter 1 according to an embodiment of this invention. FIG. 2 is a schematic perspective view thereof. In FIGS. 1 and 2, like reference numerals refer to like parts in the prior art. Reference numeral 6c denotes a lead terminal of the light-emitting device 6.

The side (bottom shown) of the lens 6a of the light-emitting device 6 projected forward is secured onto the end face 5x of the opening 5a which is formed in the illustrated left inner surface of the case 2. The illustrated left outer surface 2x of the case 2 is recessed partially from the upper surface to provide a free end at a part of the upper surface. The recessed portion is bent toward the back of the light-emitting device 6 to form the pressing portion 2u.

Likewise, the side (bottom shown) of the lens 7a of the light-receiving device 7 projected forward is secured onto the end face 5y of the opening 5b which is formed in the illustrated right inner surface of the case 2. The illustrated right outer surface 2y of the case 2 is recessed partially from the upper surface. The recessed portion is bent toward the back of the light-receiving device 7 to form the pressing portion 2v.

In this way, in the light-emitting device 6 and the light-receiving device 7 placed in the spaces inside the case 2, the sides of the lens 6a and 7a projected forward respectively are secured onto the end faces 5x and 5y of the openings. The backs of the light-emitting device 6 and the light-receiving device 7 are pressed by the pressing portions which were formed by bending the outer surfaces of the case 2.

Therefore, the light-emitting device 6 and the light-receiving device 7 each is held to distribute the weight at two points by the end face of the opening formed in the case and the pressing portion formed on the outer surface, respectively so that they can be stably anchored in the spaces within the concave case 2. The pressing portion can be easily formed by appropriately setting the mold for manufacturing the case.

Further, unlike the prior art, since they are not secured by the pallets formed inside the case, alignment by warping the portion sandwiched between the two slits formed on the outer surface is not required between the positions of the pallets and the light-emitting device 6 and light-receiving device 7. Thus, the operation of anchoring the device can be simplified. Further, since no slit is provided on the left and right outer surfaces of the case, the mechanical strength of the case is not injured. Thus, the hook for hooking the base plate can be stably anchored to the anchoring position with no limitation.

An explanation will be given of the second embodiment of this invention.

Figure 11:
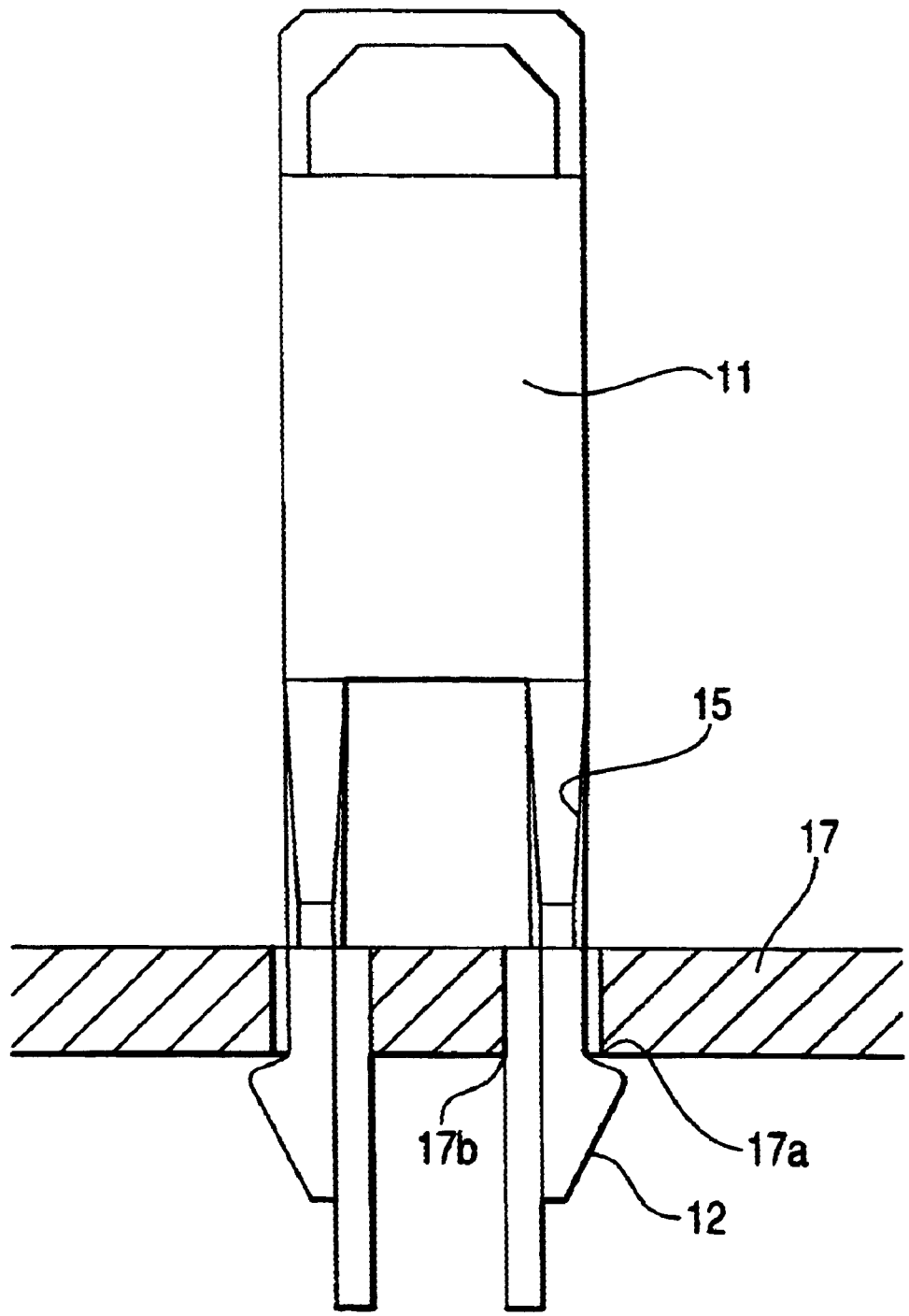
FIG. 11 is a view showing the state where the semiconductor device according to an embodiment of this invention is anchored to a base plate.

FIG. 11 shows an entire interrupter according to the second embodiment of this invention. Reference numeral 11 denotes a resin case which incorporates an photo-interrupter, i.e. an interrupter body. Anchoring legs 12 are extended downward from the lower end of the body 11 through anchoring holes 17b formed in the base plate, respectively. The resin case is monolithically formed using a transfer mold.

Reference numeral 15 denotes one of attachment stabilizing pieces. As seen from FIG. 13, the attachment stabilizing piece 15 is formed in a triangular wing shape composed of a slope 15a extending out-downward from the side of the lower portion of the body, a plane 15b in parallel to the body formed at the lower end of the slope and a plane 15c perpendicular to the body formed at the end of the parallel plane 15b.

The stabilizing piece 15 can stably support the interrupter 11 mounted upright in the base plate 17.

The shape of the stabilizing piece 15 should not be limited to the shape as described above. It can be modified as long as it can give anchoring stability when the semiconductor device such as an interrupter is anchored to the base plate.

Figure 12:
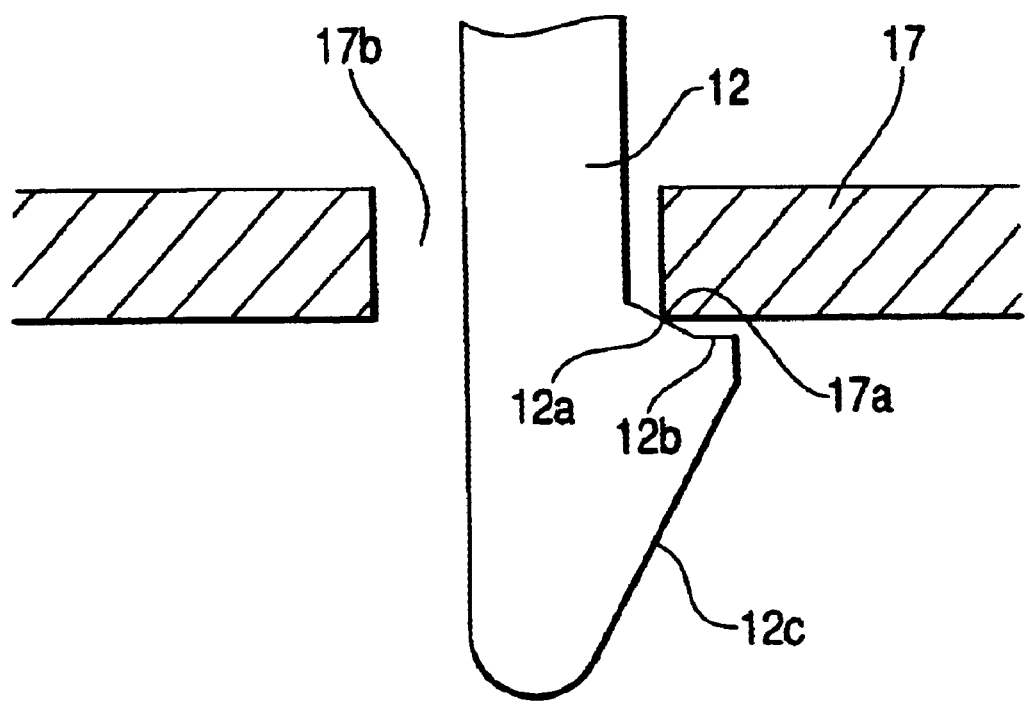
FIG. 12 is a partially enlarged view for explaining the structure of an anchoring leg of the semiconductor device.

FIG. 12 is an enlarged view of the anchoring leg 12 of the interrupter according to this invention. As seen from FIG. 12, on the side of the lower portion of the leg body, a slope 12a is formed which is brought into contact with the lower end edge 17a of the anchoring hole 17b of the base plate 17 when the leg is inserted into the anchoring hole 17b. A horizontal plane 12b is formed successively to the slope. Further, a slope 12c is formed which slopes inwardly toward the lower end of the anchoring leg from the end of the horizontal plane. The slope 12c serves as a guide face for guiding the anchoring leg 12 into the hole 17b of the base plate when the former is inserted into the latter.

The anchoring leg 12 is formed in such a length that the slope 12a is brought into contact with the lower end edge 17a of the hole 17b when the lower face 15c of the stabilizing piece 15 is brought into the surface of the base plate 17 because the leg 12 is inserted into the hole 17b of the base plate 17.

Therefore, when the anchoring leg 12 is inserted into the anchoring hole 17b, the slope 12a of the anchoring leg 12 is brought into contact with the lower end edge 17a of the hole 17b so that it bends more inward of the interrupter body from the inherent position. Thus, the restitution of the anchoring leg 12 acts on the lower end edge 17a of the hole. The slope 12a suffers from the drag force from the lower end edge. As a result, in FIG. 12, downward force acts on the anchoring leg.

In this state, the interrupter body cannot descend further so that the interrupter suffers from the downward force at all times. For this reason, the interrupter can be firmly anchored.

Incidentally, the anchoring leg 12 may have any shape as long as it has a slope in contact with the lower end edge of the anchoring hole of the base plate and can be easily inserted into the hole.

In accordance with this invention, in order to anchor the interrupter to the base plate, the anchoring leg 12 of the interrupter has only to be inserted into the anchoring hole 17b of the base plate 17. In addition, the interrupter can be firmly anchored because it suffers from the downward force at all times because of the provision of the slope 12a of the anchoring leg 12.

Incidentally, the sloping angle of the slope 12a of the anchoring leg to the horizontal plane is preferably 45° or less in view of anchoring stability.

Figure 13:
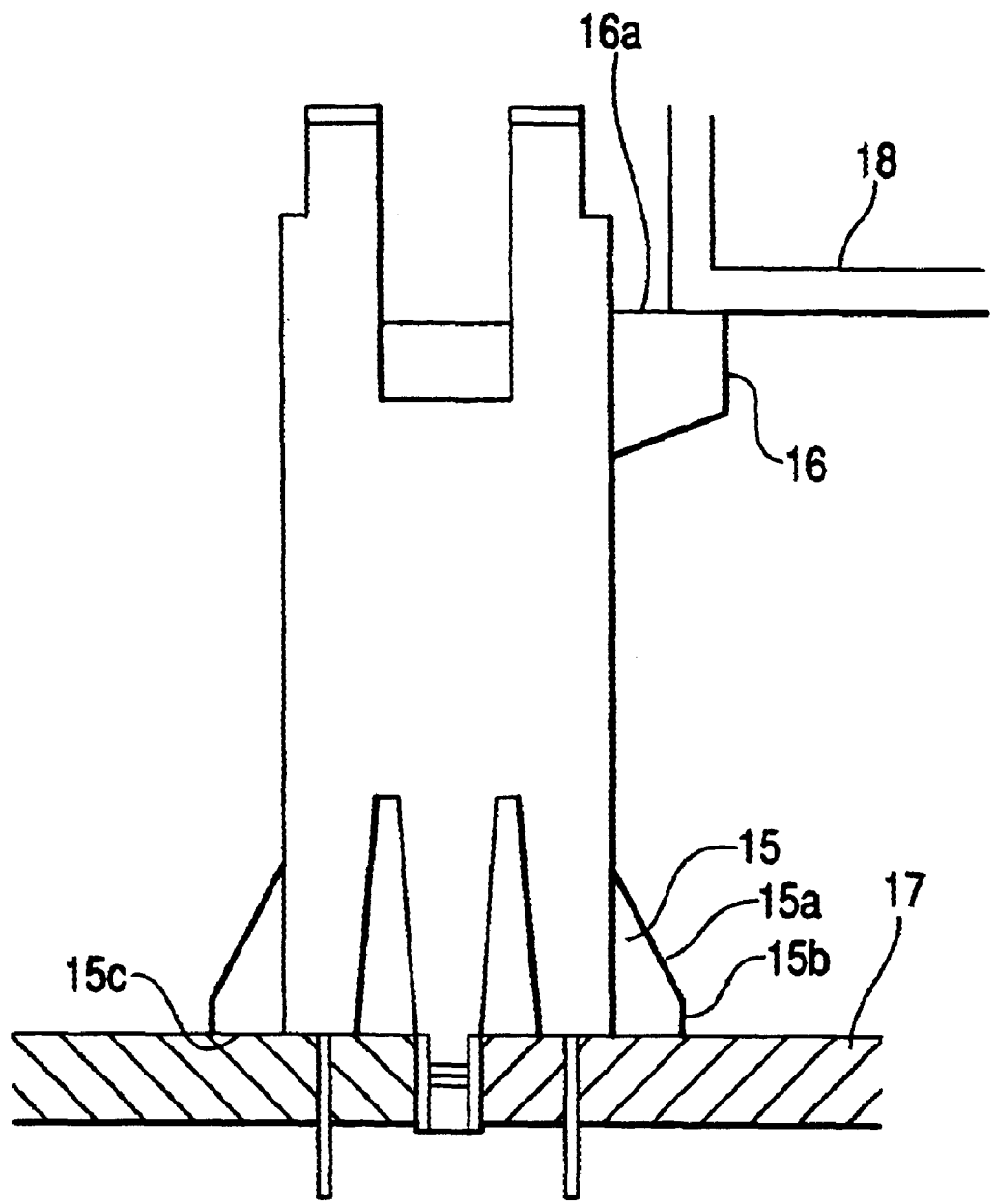
FIG. 13 is a view showing the state where the semiconductor device according to another embodiment of this invention is anchored to a base plate.
Figure 14:
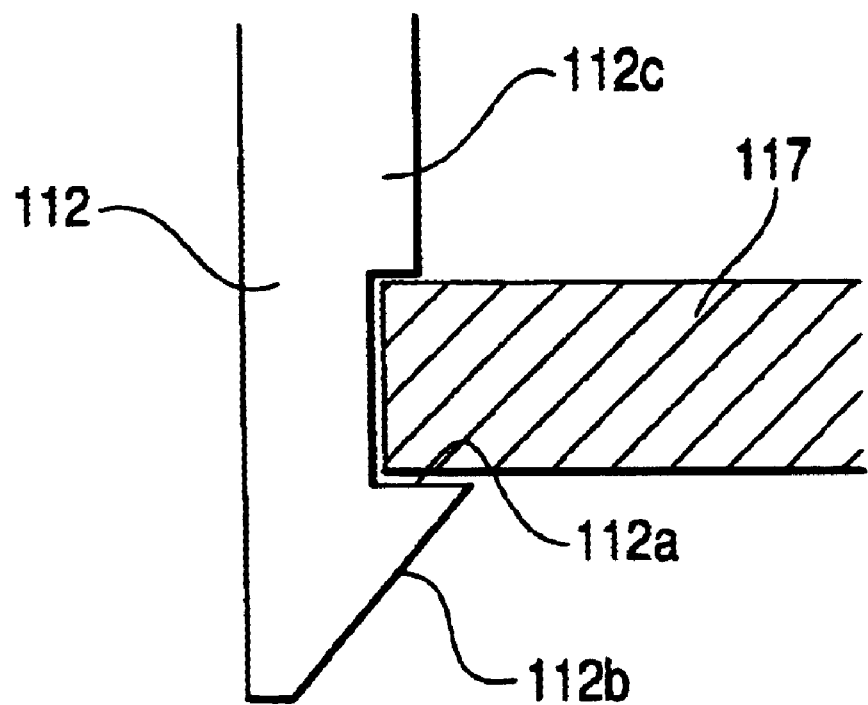
FIG. 14 is a partially enlarged view for explaining the structure of an anchoring leg of a prior art semiconductor device.

FIG. 13 shows an interrupter according to another embodiment of the semiconductor device according to this invention.

This embodiment is different from the embodiment shown in FIG. 11 in that a floatage suppressing piece 16 for suppressing the floatage of an interrupter 11 when the base plate 17 has floated is provided on e.g. the upper side surface of the interrupter 11.

The floatage suppressing piece 16 has a horizontal plane 16a which protrudes outwardly from the outer surface of the side of the interrupter. This horizontal plane 16a serves to suppress the floatage of the interrupter.

Specifically, where soldering is made to the electrode of the base plate equipped with the interrupter 11, when the soldering paste hardens and contracts, the contraction force of the soldering paste acts on the base plate so that the base plate may float. In this case, the interrupter also floats. However, in accordance with this invention, when the interrupter 11 floats, the upper surface of the floatage suppressing piece 16 is brought into contact with the frame or chassis of an appliance 18 in which the interrupter is mounted so that the floatage of the interrupter 11 can be effectively suppressed.

Incidentally, the appliance in which the interrupter is mounted may be previously provided with a member for receiving the floatage suppressing piece. Further, the shape of the floatage suppressing piece can be modified as long as it can suppress the floatage of the interrupter.

Industrial Applicability

As described hitherto, in accordance with this invention, the light-emitting device and the light-receiving device each is held to distribute the weight at two points by the end face of the opening formed in the case and the pressing portion formed on the outer surface, respectively so that they can be surely anchored in the case in a simple configuration.

Further, since no slit is provided on the outer surface of the case, reduction in the mechanical strength of the case can be avoided. The hooks for hooking the base plate can be stably coupled with the base plate.

Furthermore, in the semiconductor device according to this invention, in the state where it is anchored in the anchoring hole of the base plate, the anchoring leg is always kept in contact with the edge of the hole so that the restitution of the anchoring leg acts on the edge of the hole. As a result, downward force always acts on the anchoring leg. In addition, since the lower end of the semiconductor device body is in contact with the base plate, in order to anchor the semiconductor device to the base plate easily and firmly, the anchoring leg of the interrupter has only to be inserted into the anchoring hole of the base plate.

Moreover, provision of the attachment stabilizing piece permits the semiconductor device to be anchored more stably.

Further, in the semiconductor device according to this invention, the floatage suppressing piece is brought into contact with the chassis of the appliance even when the base plate floats, thereby suppressing the floatage of the semiconductor device. Therefore, misalignment of the semiconductor device does not occur.

What is claimed is:

1. A photo-interrupter with a light-emitting device and a light-receiving device each with a lens projected forward being housed oppositely to each other within a concave case of an opaque resin mold, characterized in that said case is monolithically formed using a transfer mold, and includes a light-emitting device holding section and a light-receiving holding section which are provided oppositely to each other and configured to hold a light-emitting device and a light-receiving device inside, respectively; and said light-emitting device holding section and said light-receiving device holding section have openings for securing sides of the projected portions thereof so that the projected portions of said light-emitting device and the light-receiving device are opposed to each other, and have pressing portions for elastically securing the light-emitting device and the light-receiving device from behind them, respectively.

2. A photo-interrupter according to claim 1, characterized in that the sides of the lenses of the light-emitting device and the light-receiving device are secured onto the end faces of the openings formed in opposite inner surfaces of said case, the backs of the light-emitting device and the light-receiving device are pressed by the pressing portions which were formed by bending the outer surfaces of the case, and said light-emitting device and said light-emitting device are anchored to said case.

3. A photo-interrupter according to claim 2, characterized in that said case has the inner surfaces where the openings of said case are formed integrally to the outer surfaces on the opposite sides and hooks for hooking a mounting base plate.

4. A photo-interrupter according to claim 3, characterized in that said hooks pass through mounting grooves in said mounting base plate to anchor said case to the mounting base plate elastically.

5. A photo-interrupter according to claim 4, characterized in that said light-emitting device and said light-receiving device are provided with lead terminals to be connected to a circuit pattern formed in said mounting base plate.

* * * * *